United States Patent [19]

Van Buskirk et al.

[11] Patent Number: 4,460,981

[45] Date of Patent: Jul. 17, 1984

[54] VIRTUAL GROUND MEMORY

[75] Inventors: Michael A. Van Buskirk, San Jose; Mark A. Holler, Milpitas, both of Calif.

[73] Assignee: Intel Corporation, Santa Clara, Calif.

[21] Appl. No.: 334,304

[22] Filed: Dec. 24, 1981

[51] Int. Cl.³ ............................................. G11C 11/40
[52] U.S. Cl. .................................... 365/189; 365/104; 365/190
[58] Field of Search ............... 365/190, 149, 189, 104, 365/94

[56] References Cited

U.S. PATENT DOCUMENTS 4,021,781  5/1977  Caudel .................................. 365/104
4,281,397  7/1981  Neal et al. ............................ 365/189
4,312,047  1/1982  Donoghue ............................ 365/189

Primary Examiner—Joseph A. Popek
Attorney, Agent, or Firm—Blakely, Sokoloff, Taylor & Zafman

[57] ABSTRACT

A virtual ground memory array where alternate bit lines in the array are selectively coupled to ground. The other bit lines are coupled to an input/output line. Diode-like shunting is used between the bit lines to eliminate parasitic paths particularly for higher programming potentials such as used in EPROMs. Substantially no increase in overhead is required to control these diode-like paths since the architecture allows them to be controlled by address signals.

14 Claims, 5 Drawing Figures

VIRTUAL GROUND MEMORY

BACKGROUND OF THE INVENTION

1. Field of the Invention

The invention relates to the field of semiconductor memories and particularly those employing virtual grounds.

2. Prior Art

In semiconductor memory arrays it is common to couple one terminal of each memory cell to ground. The other terminal is selectively coupled to a bit line. The current flow (or the lack thereof) between the bit line and ground (through the memory cell) is sensed to determine the state of the cell. This memory array architecture requires grounding lines disposed throughout the array.

In some memories, neither terminal of the memory cells are permanently coupled to ground. Rather, when a cell is selected one of its terminals is then coupled to ground and the other to a bit line. In this arrangement, lines in an array are used to ground cells and also as a bit line for other cells. This prior art "virtual" ground memory is discussed in more detail in conjunction with FIG. 1.

The major advantage to virtual ground memories is that they can be more densely fabricated. This is particularly true for larger arrays (e.g., 256K, 1M, etc.) where the overhead circuitry for the virtual grounds is less significant. Perhaps the major problem in the fabrication of these memories is the inherent parasitic paths which occur. These paths are discussed in conjunction with FIG. 1. The parasitic path problem is worse for memories requiring relatively high potentials for programming such as for electrically programmable read-only memories (EPROMs).

See FIG. 11 of U.S. Pat. No. 4,267,632 for an example of a prior art virtual ground memory.

SUMMARY OF THE INVENTION

An improved memory array employing virtual grounds is described. The array includes a plurality of generally parallel, spaced-apart array lines and a plurality of memory cells coupled between these array lines. First switching means are employed for selectively allowing current to flow in a first direction between each of the array lines. Second switching means are also used for selectively allowing current to flow in a second direction, opposite to the first direction, between the array lines. Address decoding means are used for controlling the first and second switching means. The first and second switching means act as diodes to prevent parasitic paths particularly during programming of an EPROM.

DETAILED DESCRIPTION OF THE INVENTION

An improved memory array employing virtual grounding is described. In the following description, numerous specific details are set forth such as specific number of address signals, in order to provide a thorough understanding of the present invention. It will be obvious to one skilled in the art that the present invention may be practiced without these specific details. In other instances, well-known circuits are not described in detail in order not to obscure the present invention in unnecessary detail.

Figure 1:
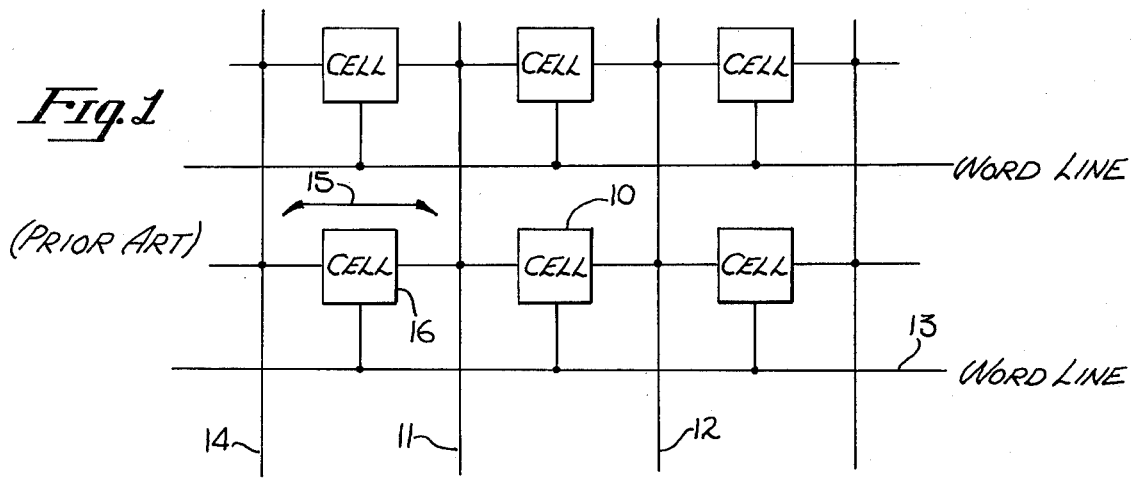
FIG. 1 is an electrical schematic showing a portion of a prior art virtual ground memory array.

In its presently preferred embodiment, the invented memory array is fabricated employing metal-oxide-semiconductor (MOS) technology. More specifically, n-channel devices with polysilicon gates are employed. The memory array includes a plurality of electrically programmable memory cells which are erased by exposing the array to ultraviolet or other radiation. A higher potential is required for programming than for reading with these cells. With the presently preferred cell, approximately 5 volts is used for reading while a potential of approximately 12 volts is required for programming. The currently preferred cell is described in copending application Ser. No. 196,838, filed Oct. 14, 1980 and assigned to the assignee of the present application. However, the present invention may be used with other cells and other memories. Referring first to FIG. 1, a portion of a prior art virtual ground memory is illustrated. The array includes a plurality of parallel, spaced-apart bit lines such as lines 11 and 12 and a plurality of word lines which are generally perpendicular to the bit lines. Memory cells such as cell 10 are disposed between the bit lines and coupled to a word line. Thus, for example, when word line 13 is selected, the memory cells along this line, such as memory cells 10 and 16 are selected.

Assume that the word line 13 has been selected and that cell 10 along this word line is to be read. Then, for instance, line 12 is coupled to ground while line 11 is coupled to a sense amplifier. The current through the cell 10 is sensed to determine the state of cell 10. A parasitic path through cell 16 may cause a problem in sensing the state of cell 10. Obviously, if line 14 is held at ground potential and if cell 16 is conducting, the parasitic path illustrated by path 15, would prevent sensing of the current through cell 10 on line 11. Care must be taken to assure that line 14 is at a sufficiently high potential relative to line 11 to prevent the parasitic conduction through path 15. Note that if line 14 is left "floating", sufficient charge may be transferred to this line through path 15 to cause a false reading. The parasitic paths become more of a problem when higher potentials are employed, such as those needed to program EPROM cells.

Figure 3:
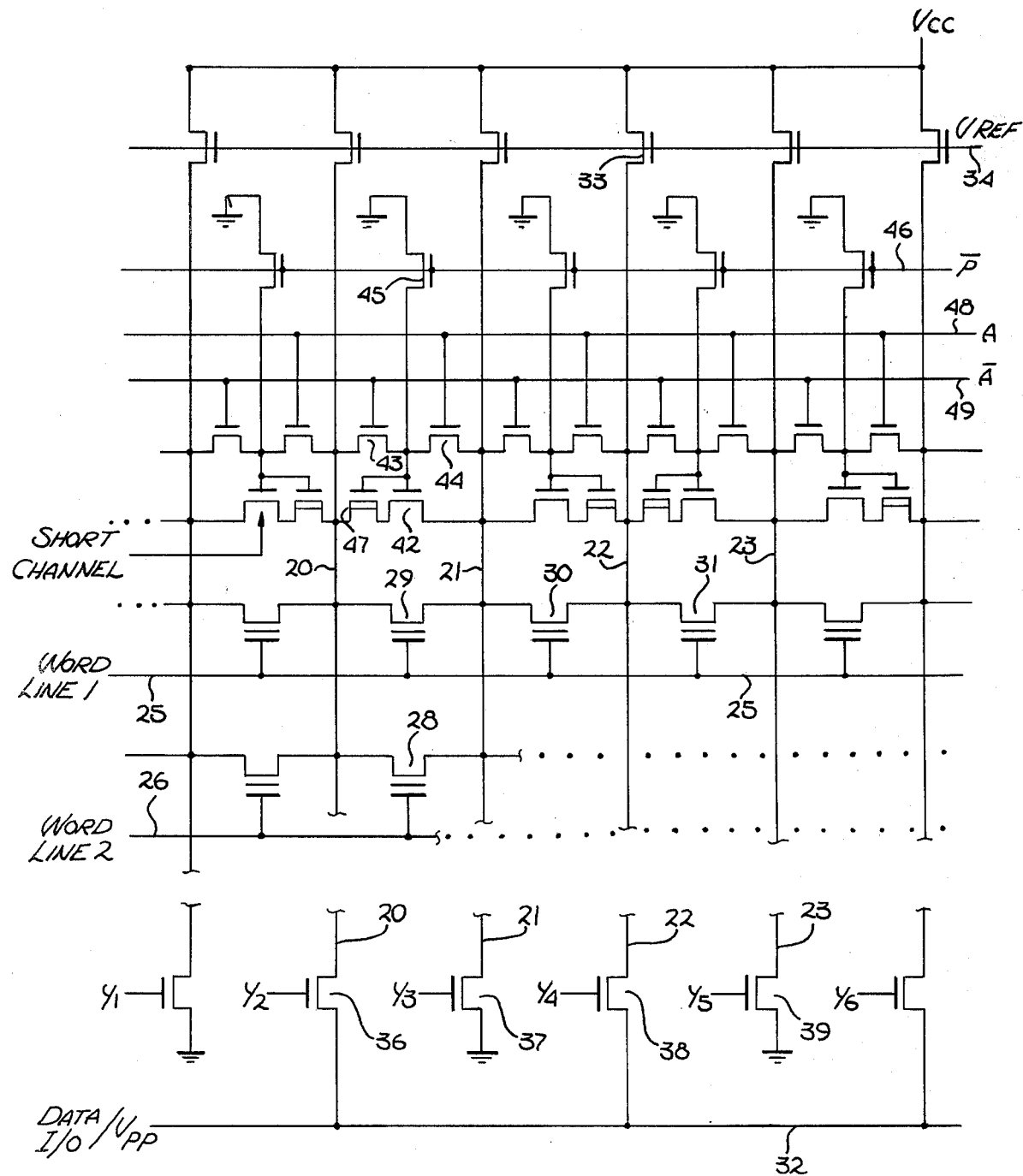
FIG. 3 is an electrical schematic of a portion of a memory array built in accordance with the present invention.

Referring now to FIG. 3, in the presently preferred embodiment, the portion of the illustrated array includes a plurality of parallel, spaced-apart bit lines (vertical lines in the drawing) such as lines 20, 21, 22 and 23. Disposed between each of these lines are rows of memory cells such as cells 29, 30 and 31 coupled to the word line 25 and similarly, cell 28 disposed along a word line 26. As will be appreciated, only a few bit lines, word lines and cells are illustrated in order not to overcomplicate the drawing.

Every other bit line is coupled to the line 32 through a field-effect transistor. For instance, lines 20 and 22 are coupled to line 32 through transistors 36 and 38, respectively. The remaining alternate bit lines are coupled to ground through transistors. For example, lines 21 and 23 are selectively coupled to ground through transistors 37 and 39, respectively. The transistors 36, 37, 38 and 39, and like transistors in the array, receive decoded address signals identified in FIG. 3 as $Y_1$–$Y_6$. The manner in which the address signals are decoded is described in conjunction with FIG. 4. Thus, the bit lines in the array are selectively coupled to an input/output line 32 or to ground. The line 32 as will be described is coupled to a sense amplifier for sensing data; this line also couples data to the array during programming. During programming, line 32 is brought to the $V_{pp}$ potential (approximately 10 volts) if a selected cell is to be programmed.

The other ends of the bit lines 20, 21, 22 and 23 are coupled through transistors to the $V_{cc}$ potential (5 volts). For example, line 22 is coupled through transistor 33 to $V_{cc}$. During reading, the gate of transistor 33 (line 34) and like gates are coupled to a reference potential. This causes all the bit lines to be pulled towards $V_{ref}$.

Figure 2:
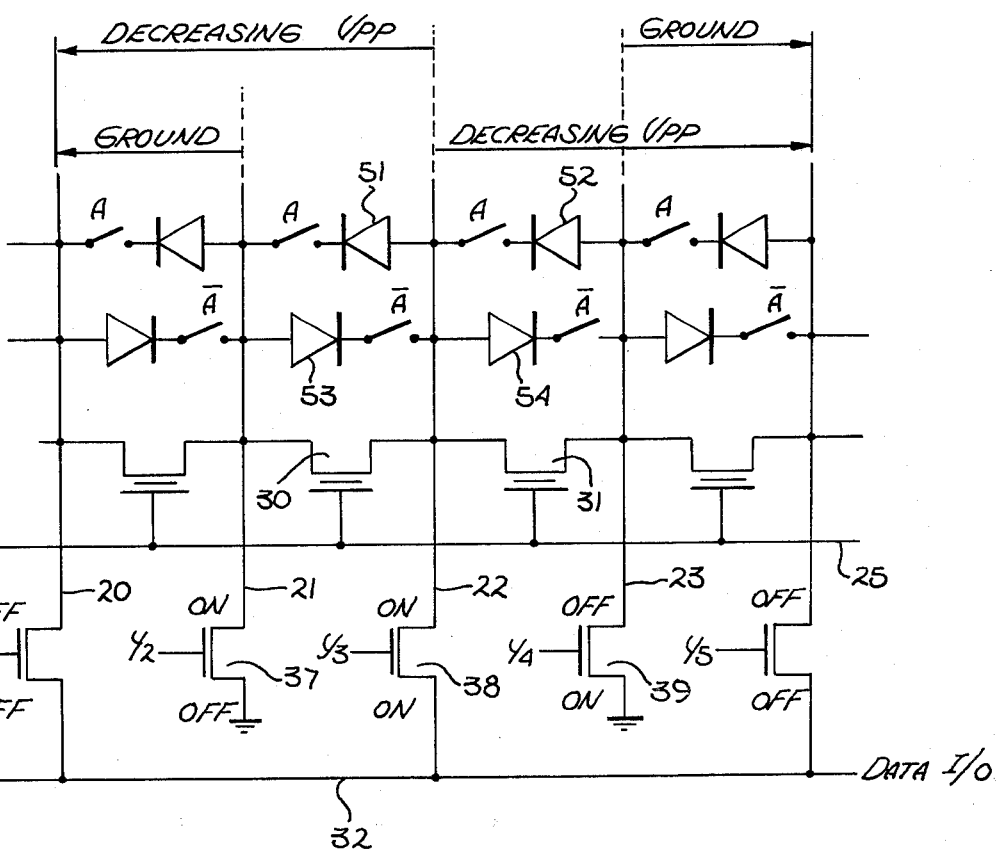
FIG. 2 is an approximate equivalent circuit for a memory array built in accordance with the present invention. This diagram is used to describe the diode-like operation of transistors used to prevent parasitic paths during programming.

Four transistors are disposed between each of the bit lines to provide a diode-like operation illustrated more graphically as diodes 51 and 53 of FIG. 2. By way of example, as shown in FIG. 3, transistor 42 is coupled between lines 20 and 21. The gate of this transistor is coupled to ground through transistor 45. The gate of transistor 45 is also coupled to line 20, through transistor 43 and to line 21 through transistor 44. Transistor 45 and like transistors have their gates coupled to line 46 which line receives the complement of the programming signal, $\overline{P}$. Transistor 43 and like transistors have their gates coupled to line 49 which receives the $\overline{A}$ signal. Similarly, transistors 44 and like transistors have their gates coupled to line 49 which receives the A signal. The generation of the A and $\overline{A}$ signal for lines 48 and 49 is described in conjunction with FIG. 5.

Transistors 42, 43, 44 and 45 are ordinary field-effect transistors. It is believed, however, that better operation is obtained if the channel of transistor 42 is a relatively short channel. For instance, a source-to-drain gate length of 2 microns is preferred. This provides an effective source-to-drain separation of approximately 1 micron, after taking into account the lateral diffusion into the channel from these regions. This shorter channel provides more effective diode-like operation which operation will be discussed in more detail in conjunction with FIG. 2.

If transistor 42 is a short channel, field-effect transistor, depletion mode transistor 47 is placed in series with transistor 42 between the alternate bit/data lines, as shown in FIG. 3. This reduces the potential across the transistor 42 and prevents the breakdown of the diode-like action of transistor 42. In practice, the threshold voltage of the depletion mode transistor 47 is chosen such that it generally equals the minimum voltage drop across transistor 42 during programming. Depletion mode transistor 47 is placed between transistor 42 and the line receiving the $V_{pp}$ potential.

First, the array of FIG. 3 shall be examined during reading. Assume that cell 30 is to be accessed. For this condition, word line 25 is brought high. Also, $V_{ref}$ on line 34 is present and since this is a non-programming mode, line 46 is high. Both A and $\overline{A}$ are low during reading as will be apparent for the circuit of FIG. 5. With line 46 high, transistor 45 conducts and transistor 42 and like transistors are off. Thus, for all practical purposes, transistors 42, 43, 44 and 45 and like transistors can be ignored during reading.

The address decoders to access cell 30 provide high signals for $Y_3$ and $Y_4$ and low signals for all the remaining Y lines such as $Y_1$, $Y_2$, $Y_5$ and $Y_6$. This brings line 21 to ground potential through transistor 37 (even though $V_{ref}$ is present on line 34) and brings line 22 to approximately $V_{ref}$. Now the current, or lack thereof, through device 30 can be sensed on line 32. That is, if cell 30 is conducting the current through transistor 38, line 22, cell 30, line 21 and transistor 37 (to ground) is sensed. No other cells are conducting between lines 21 and 22 since only word line 25 is selected.

Assume that cell 29 is conducting, thus providing a possible parasitic path. Note line 20 is at $V_{ref}$, thus a current can flow through cell 29. However, since line 21 is at ground potential the current through cell 29 does not alter the sensing on line 32. If cell 31 is conducting, current will not flow between the lines 22 and 23 through cell 31 since both lines 22 and 23 are at the $V_{ref}$ potential. Thus, no parasitic paths are present to affect the reading on line 32.

Now similarly, if cell 31 is selected for reading, transistors 38 and 39 conduct and like transistors such as transistors 36 and 37 are off. Again, an examination of possible parasitic paths will show that none are present.

It should be noted that with the selective coupling of alternate bit lines to ground a mirror symmetry exists in the array between alternate lines when one considers the direction of current flow through the selected cells. This symmetry aids in eliminating parasitic paths during reading. During programming this symmetry is used to advantage in conjunction with a unique decoding arrangement to eliminate parasitic paths.

Referring now to FIG. 2, a portion of the array of FIG. 3 is again illustrated including the input/output line 32, bit lines 20, 21, 22 and 23, transistors 37, 38 and 39 and cells 30 and 31. For purposes of explanation, transistors 42, 43, 44 and 45 and like groups of transistors are illustrated as opposite facing diodes disposed between each of the bit lines. The diodes for directing current in one direction such as diodes 53 and 54 are coupled across the bit lines when the $\overline{A}$ signal is high. Similarly, the diodes 51 and 52 and like diodes are coupled across the bit lines when the A signal is high.

Referring again to FIG. 3, if the A signal on line 48 is high, then transistor 44 and like transistors conduct. This causes the gate of transistor 42 to be coupled to line 21 and thus provides a diode-like path through transistor 42 between lines 21 and 20 as represented by diodes 51 and 52 of FIG. 2. Conversely, if the $\overline{A}$ signal is high, transistors 43 and like transistors conduct and a path exists as indicated by diodes 53 and 54 of FIG. 2. Note that during programming, the $\overline{P}$ signal is low thus transistor 45 and like transistors do not conduct and also the $V_{ref}$ signal (line 34) is at ground potential.

Assume that cell 30 of FIG. 2 is to be programmed. The decoded Y signals cause transistors 37 and 38 to conduct while the other "Y" transistors such as transistor 39 are off. This is indicated as "case 1" in FIG. 2.

Since line 25 is selected, a potential ($V_{pp}$) applied to line 32 programs the cell 30. Obviously, if the cell is not to be programmed, the $V_{pp}$ potential is not coupled to the line 32.

For programming of the cell 30, the $\overline{A}$ signal is high and the A signal low. The diode-like action as represented by diodes 53 and 54 of FIG. 2 prevent any parasitic paths which would cause programming of the other cells along line 25. The cells to the left of line 21 will not be programmed since line 21 is at ground potential. That is, the $V_{pp}$ potential even after passing through cell 30 will not propagate to the left in the array since line 21 is grounded. (This is indicated for case 1 above the circuit of FIG. 2.) To the right of line 22, the positive potential is transferred through diode 54 to line 23 and so on along the array. There is a diode-like drop between lines 22 and 23 caused by diode 54 and a similar drop between each of the successive lines in the array. This is indicated for case 1 as a decreasing $V_{pp}$. The maximum potential across any of the cells such as cell 31 will be equal to only one diode drop. This potential is not sufficient to cause parasitic programming of any of the cells.

If the cell 31 is to be programmed then transistors 38 and 39 conduct while the other transistors such as transistors 37 are off. (This is indicated as "case 2".) For this condition, the $V_{pp}$ potential can be applied through transistor 38 to cell 31. Note that this time the potential is applied in a left-to-right direction whereas for the programming of cell 30 it was applied in a right-to-left direction. For the programming of cell 31, A is high and $\overline{A}$ low. Thus, diodes 51 and 52 are coupled across the bit lines and the diodes 53 and 54 are out of the circuit. For this case, there is a decreasing $V_{pp}$ to the left of line 22 and a blocking to the right of line 23 since line 23 is grounded.

Figure 5:
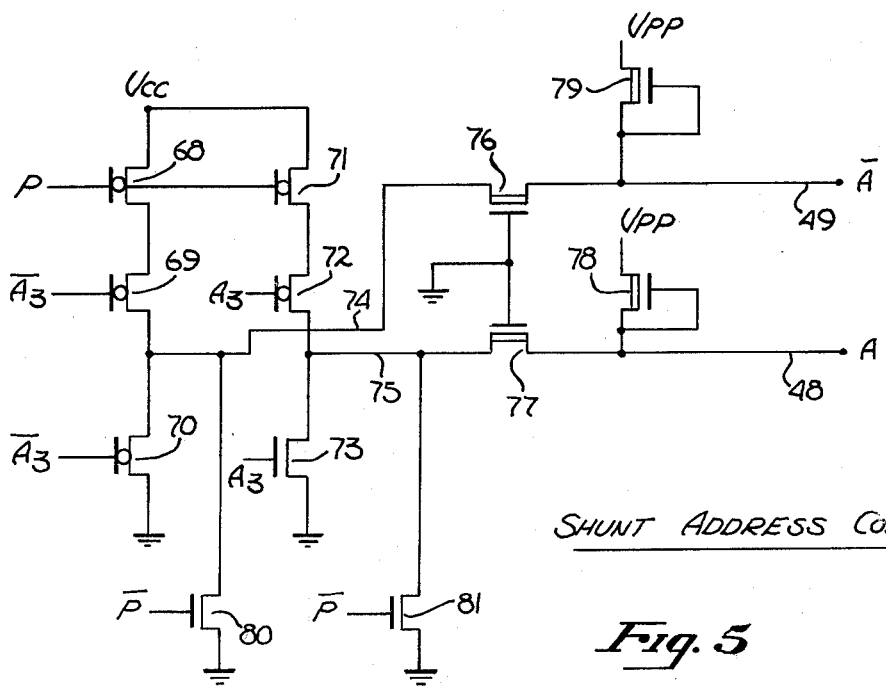
FIG. 5 is an electrical schematic of a decoder used to control the diode-like shunting used in the present invention.

The A and $\overline{A}$ signals which are generated by the circuit of FIG. 5, provide the appropriate left-to-right and right-to-left shunting to isolate the cells for programming. (While in the present invention, the diode-like shunting is only used for programming, in some memories this shunting may be used during reading.)

Figure 4:
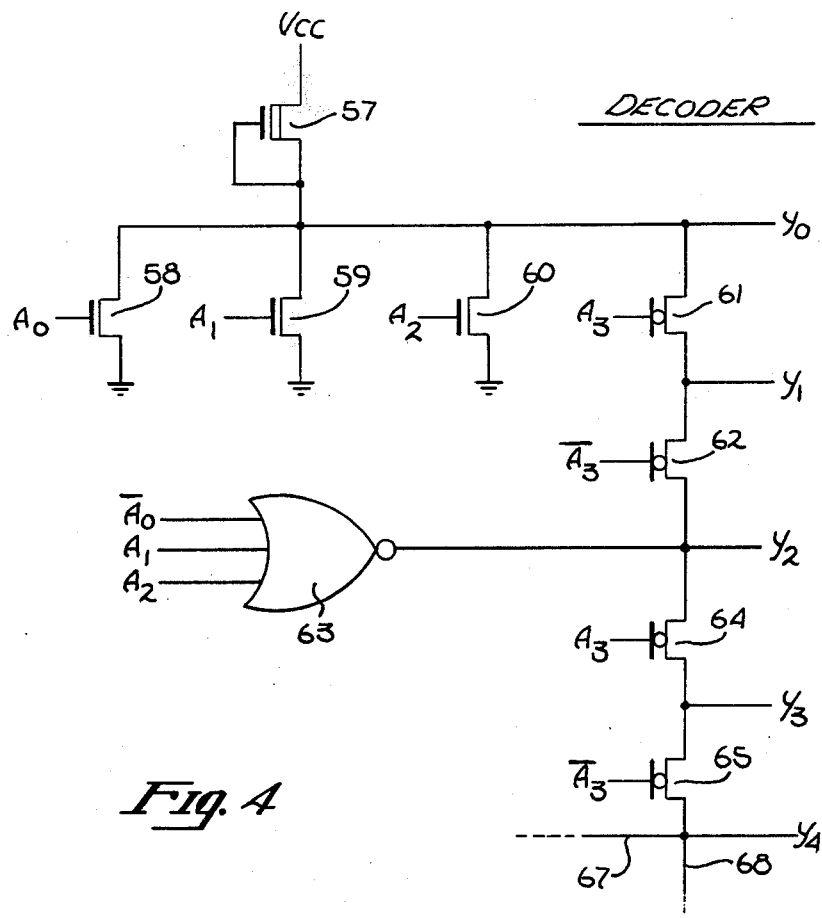
FIG. 4 is an electrical schematic of a portion of address decoders used in conjunction with the present invention.

Referring to FIG. 4, a partial address decoder is illustrated for a memory having 16 bit or column lines. (The memory may include several groups of 16 column lines, for instance, where the memory has an organization of 4K×8.) For this case, four column address bits are required ($A_0$–$A_3$). Each combination of the address signals $A_0$, $A_1$ and $A_2$ and their complements are coupled to a NOR gate such as NOR gate 63. One of the NOR gates is shown in detail and includes transistors 58, 59 and 60 coupled to receive the address signals $A_0$, $A_1$, and $A_2$. The $Y_0$ line is coupled to $V_{cc}$ for this NOR gate through the depletion mode transistor 57. Thus, if $A_0$, $A_1$ and $A_2$ are all low, line $Y_0$ will be high.

A second level of decoding is obtained from the $A_3$ signal. This decoding interconnects each of the NOR gates in the decoder. The $Y_0$ line, for example, is coupled to the $Y_2$ line through the zero threshold voltage transistors 61 and 62. The common junction between these two transistors provides the $Y_1$ line and signal. The gate of transistor 61 receives the $A_3$ signal while the gate of transistor 62 receives the $\overline{A}_3$ signal. Similarly, transistors 64 and 65 are used to provide coupling between the $Y_2$ line and $Y_4$ line and to provide the $Y_3$ signal. Line 67 is coupled to another NOR gate and line 68 continues on through additional transistors controlled by the $A_3$ signal in order to complete the decoder and to provide the output signals $Y_0$–$Y_{16}$. The $Y_1$ and $Y_3$ lines and the other odd numbered Y lines are used for controlling those transistors in the array which couple the bit lines to ground. The even numbered Y lines are coupled to those transistors which provide coupling between the bit lines and the input/output data line 32.

The shunt address control buffer of FIG. 5 develops the A and $\overline{A}$ signal from the $A_3$ and $\overline{A}_3$ signal. An inverter stage comprising zero threshold transistors 68 and 69, and an enchancement mode transistor 70, receives the $\overline{A}_3$ and $A_3$ signal on transistors 69 and 79, respectively. A second inverter stage comprising transistors 71, 72 and 73 receives the $A_3$ and $\overline{A}_3$ signal on transistors 72 and 73, respectively. Transistors 68 and 71 receive the P signal which is high only during programming. Lines 74 and 75 are coupled to ground through transistors 80 and 81, respectively. These transistors receive the $\overline{P}$ signal. For nonprogramming modes, lines 74 and 75 are coupled to ground and both lines 48 and 49 are held at ground potential. During the programming modes, if $A_3$ is high and $\overline{A}_3$ low, line 74 will be at ground potential while line 75 is at $V_{cc}$. This will allow line 48 to be drawn to a $V_{pp}$ through depletion transistor 78 while line 49 is held at ground potential. Conversely, if $A_3$ is low and $\overline{A}_3$ high, line 49 is held at $V_{pp}$ and line 48 at ground. The depletion transistors 76 and 77 prevent the $V_{pp}$ potential from being coupled back to the inverters. Therefore, with the decoding arrangement of FIG. 4, the A and $\overline{A}$ signals are easily developed from the $A_3$ and $\overline{A}_3$ signals.

Thus, a virtual ground memory array has been disclosed which includes alternate coupling between the bit or column lines in the array and ground, and wherein a diode-like shunting is used to prevent parasitic paths. Very little additional circuitry is required to control the shunting paths since the architecture facilitates the use of the address signals for this purpose.

We claim:
1. An improved memory array employing virtual grounding, comprising:
   a plurality of generally parallel, spaced-apart array lines;
   a plurality of memory cells coupled between said array lines;
   first switching means coupled between said array lines for selectively allowing current to flow in a first direction between each of said array lines;
   second switching means coupled between said array lines for selectively allowing current to flow in a second direction, opposite to said first direction, between said array lines, and,
   decoding means coupled to receive address signals and coupled to said first and second switching means for controlling said first and second switching means thereby allowing said current to flow in said first and second directions between said array lines,
   whereby virtual grounding may be achieved with fewer parasitic paths.
2. The memory array defined by claim 1 wherein alternate ones of said array lines are selectively coupled to ground through third switching means.
3. The memory array defined by claim 2 wherein the others of said array lines are selectively coupled to a data line through fourth switching means.
4. The memory array defined by claim 3 wherein said memory cells are electrically programmable cells and wherein said first and second switching means are only activated during the programming of said cells.

5. The memory array defined in claim 4 wherein said array lines are held at a reference potential during the reading of said cells.

6. The memory array defined by claim 1 wherein said first and second switching means includes between each line:
- a first field-effect transistor (FET) coupled between said lines;
- a second FET coupled between the gate of said first FET and one of said lines;
- a third FET coupled between said gate of said first FET and the other of said lines.

7. The memory array defined by claim 6 including a fourth FET for selectively coupling to ground said gate of said first FET.

8. The memory array defined by claim 6 wherein said first FET has a relatively narrow channel.

9. The memory array defined by claim 8 further including at least one depletion mode transistor coupled in series to said first FET between said lines.

10. An improved memory array employing virtual grounding comprising:
- a plurality of generally parallel, spaced-apart array lines;
- a plurality of electrically programmable memory cells coupled between said array lines;
- a data line;
- a first plurality of field-effect transistors (FETS) for selectively coupling alternate ones of said array lines to said data line;
- a second plurality of FETs for selectively coupling the others of said array lines to ground; and reading means for coupling said array lines to a reference potential during the reading of said cells,
whereby a memory array with selective ground connections to said array lines is realized.

11. The memory array defined by claim 10 including:
- first switching means coupled between said array lines for selectively allowing current to flow in a first direction between each of said array lines coupled between said array lines;
- second switching means coupled between said array lines for selectively allowing current to flow in a second direction, opposite to said first direction, between said array lines; and,
- decoding means coupled to receive address signals and coupled to said first and second switching means for controlling said first and second switching means thereby allowing said current to flow in said first and second directions between said array lines.

12. The memory array defined by claim 11 wherein said first and second switching means includes between each line:
- a first field-effect transistor (FET) coupled between said lines;
- a second FET coupled between the gate of said first FET and one of said lines;
- a third FET coupled between said gate of said first FET and the other of said lines.

13. The memory array defined by claim 12 including a fourth FET for selectively coupling to ground said gate of said first FET.

14. The memory array defined by claim 13 wherein said first and second switching means are only activated during the programming of said cells.

* * * * *